(12) United States Patent
Oh

(10) Patent No.: US 6,300,209 B1
(45) Date of Patent: Oct. 9, 2001

(54) METHOD OF FABRICATING TRIPLE WELL OF SEMICONDUCTOR DEVICE USING SEG

(75) Inventor: Jae Geun Oh, Kyungki-Do (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/599,640

(22) Filed: Jun. 23, 2000

(30) Foreign Application Priority Data

Jun. 24, 1999 (KR) .................................................. 99-24072

(51) Int. Cl.$^7$ ................................................ H01L 21/331
(52) U.S. Cl. ...................... 438/370; 438/429; 438/109; 438/618; 438/630
(58) Field of Search .................................. 438/370, 429, 438/106, 149, 109, 117, 618, 668, 630, 411, 27, 5, 25, 6, 110, 157, 107, 667, 626

(56) References Cited

U.S. PATENT DOCUMENTS

| | | |
|---|---|---|
| 4,728,623 | 3/1988 | Lu et al. . |
| 4,738,937 | 4/1988 | Parsons . |
| 4,820,654 * | 4/1989 | Lee ........................................ 438/429 |
| 4,918,029 | 4/1990 | Kim . |
| 5,004,702 | 4/1991 | Samata et al. . |
| 5,030,583 | 7/1991 | Beetz, Jr. . |
| 5,032,538 | 7/1991 | Bozler et al. . |
| 5,045,494 | 9/1991 | Choi et al. . |
| 5,272,109 | 12/1993 | Motoda . |
| 5,322,802 | 6/1994 | Baliga et al. . |
| 5,322,814 | 6/1994 | Rouse et al. . |
| 5,378,652 | 1/1995 | Samata et al. . |
| 5,432,121 | 7/1995 | Chan et al. . |
| 5,435,856 | 7/1995 | Rouse et al. ........................... 136/225 |
| 5,494,837 | 2/1996 | Subramanian et al. . |
| 5,508,225 | 4/1996 | Kadoiwa . |
| 5,567,652 | 10/1996 | Nishio . |
| 5,599,724 | 2/1997 | Yoshida . |
| 5,627,102 | 5/1997 | Shinriki et al. . |
| 5,633,201 | 5/1997 | Choi ....................................... 438/620 |
| 5,744,377 | 4/1998 | Sekiguchi et al. .................... 438/674 |
| 5,773,350 | 6/1998 | Herbert et al. . |
| 5,804,470 | 9/1998 | Wollesen ............................... 438/141 |
| 5,869,354 * | 2/1999 | Leedy .................................... 438/110 |

FOREIGN PATENT DOCUMENTS

| | | |
|---|---|---|
| 54-158880 | 12/1979 | (JP) . |
| 2-37745 | 2/1990 | (JP) . |
| 2-260667 | 10/1990 | (JP) . |
| 8-236728 | 9/1996 | (JP) . |
| 10-107219 | 4/1998 | (JP) . |
| 11-097519 | 4/1999 | (JP) . |

* cited by examiner

*Primary Examiner*—Matthew Smith
*Assistant Examiner*—Igwe Anya
(74) *Attorney, Agent, or Firm*—Pennie & Edmonds LLP

(57) ABSTRACT

There is disclosed a triple well of a semiconductor device using SEG and method of forming the same. The method of forming a triple well of a semiconductor device using SEG according to the present invention is characterized in that it comprises the steps of forming a first oxide film pattern at a given portion on a silicon wafer; using SEG process, forming a first un-doped silicon epi-layer on the exposed silicon wafer in which the first oxide film pattern is not formed; selectively performing ion injection to form an underlying n-well at a given region of the first silicon epi-layer; forming a second oxide film pattern on the upper portion of the first oxide film pattern and at a given region on the first silicon epi-layer; using in-situ boron-doped SEG process, forming a second doped silicon epi-layer on the first silicon epi-layer; performing a n-well counter doping ion injection to form a profiled n-well at a given region of the second silicon epi-layer; and forming a first p-well and a second p-well at a given region of the second silicon epi-layer, respectively. Thus, it can block the latch-up current path of the parasitic PNPN structure that can be shown due to closely located n-well and p-well junction when a triple well is formed using SEG process and a usual medium current ion implanter, thus making it possible to manufacture a high reliable and qualified.

15 Claims, 8 Drawing Sheets

METHOD OF FABRICATING TRIPLE WELL OF SEMICONDUCTOR DEVICE USING SEG

BACKGROUND OF THE INVENTION

1. Field of the Invention

The invention relates generally to a method of forming a triple well of a semiconductor device, and more particularly to a method of forming a triple well of a semiconductor device in which a medium current implanter not a high energy ion implanter and SEG (selective epitaxial growth) process are used to form a triple well, thus preventing a latch-up current path of a parasitic PNPN structure that can create between neighboring n-well and p-well.

2. Description of the Prior Art

FIGS. 1A through 1F are flowcharts to illustrate a conventional method of forming a triple well of a semiconductor device. First, referring to FIG. 1A, a field oxide film 2 is formed at a given region of a silicon wafer 1. Then, as shown in FIG. 1B, ion injection mask process for forming a n-type buried layer is performed using a photoresist 3, and then ion injection process for forming a n-type buried layer 4 is performed using a high energy ion implanter.

Next, as shown in FIG. 1C, after the photoresist 3 is removed, ion injection mask process for forming an n-well is performed again using a photoresist 5. Then, ion injection process for forming an n-well 6 and a p-channel field stop region 7 is performed using a high-energy ion implanter.

Thereafter, as shown in FIG. 1D, after the photoresist 5 is removed, ion injection mask process for forming a p-well is performed again using a photoresist 8. Then, ion injection process for forming a p-well 9 and an n-channel field stop region 10 is performed using a high-energy ion implanter, thus forming a profiled p-well.

Then, as shown FIG. 1E, the photoresist 8 is removed, the formed profiled n-well and p-well are activated by thermal process to form a first p-well 11 and n-well 12, and a second p-well 13, thus completing a triple well forming process.

Next, as shown is FIG. 1F, using a subsequent process, a nMOS is formed at the first p-well 11 and the second p-well 13, and a pMOS is formed at the n-well 12. In particular, an independent transistor, that is different from the transistor formed at the first p-well 11, may be formed at the second p-well 13. As being surrounded by the n-type buried layer, it can be protected from an external voltage or noises that may be introduced.

However, in case of non-volatile memory devices (logic circuits) or higher integrated devices having more than 256 M DRAM, it is required that reduction of the device area must be considered. Thus, it is a trend that the device separation distance is reduced. Therefore, in CMOS device in which the nMOS and pMOS devices are closely located, it is unavoidable that a latch-up phenomenon due to a parasitic PNPN structure occurs.

FIG. 2 is a schematic view to illustrate a latch-up current paten at a CMOS device manufactured by a conventional method. As shown in FIG. 2, a latch-up current path is first generated within a bulk and then is gradually diffused into its surface, thus generating a latch-up phenomenon that is critical to the device operation.

FIG. 3 is a schematic view of a latch-up current path at a STI (shallow trench isolation) structure to which a lot of study has been recently made as a device separation technology in a device with more than 256 M DRAM. In this structure, though some of a latch-up current path is blocked toward the surface, it is unavoidable that a latch-up phenomenon occurs because latch-up current is first generated within its bulk.

SUMMARY OF THE INVENTION

It is therefore an object of the present invention to provide a triple well of a semiconductor device using SEG and method of forming the same in which a medium current implanter not a high energy ion implanter and SEG (selective epitaxial growth) process are used to form a triple well, thus preventing a latch-up current path of a parasitic PNPN structure that can create between neighboring n-well and p-well.

In order to accomplish the above object, a method of forming a triple well of a semiconductor device using SEG according to the present invention is characterized in that it comprises the steps of forming a first oxide film pattern at a given portion on a silicon wafer; using SEG process, forming a first un-doped silicon epi-layer on the exposed silicon wafer in which the first oxide film pattern is not formed; selectively performing ion injection to form an underlying n-well at a given region of the first silicon epi-layer; forming a second oxide film pattern on the upper portion of the first oxide film pattern and at a given region on the first silicon epi-layer; using in-situ boron-doped SEG process, forming a second doped silicon epi-layer on the first silicon epi-layer; forming a n-well counter doping ion injection to form a profiled n-well at a given region of the second silicon epi-layer; and forming a first p-well and a second p-well at a given region of the second silicon-epi-layer, respectively.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
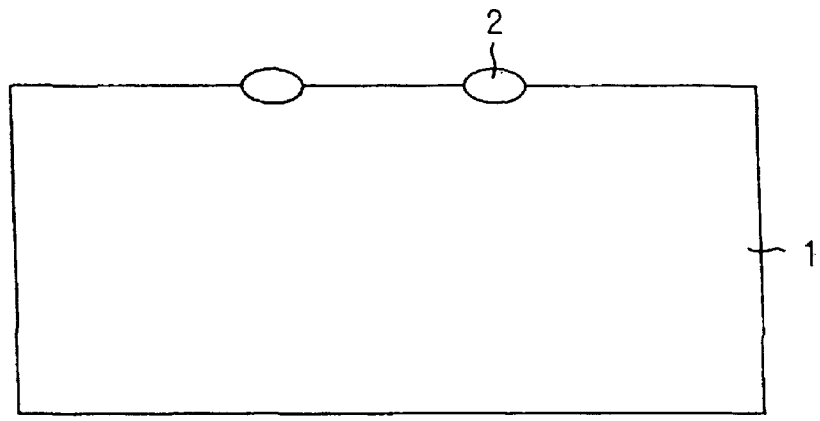
FIGS. 1A through 1F are flowcharts to illustrate a conventional method of forming a triple well of a semiconductor device.
Figure 1B:
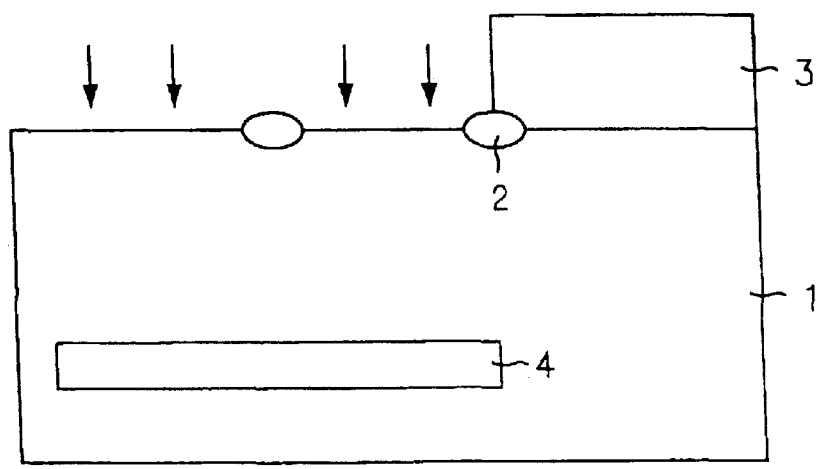
Figure 1C:
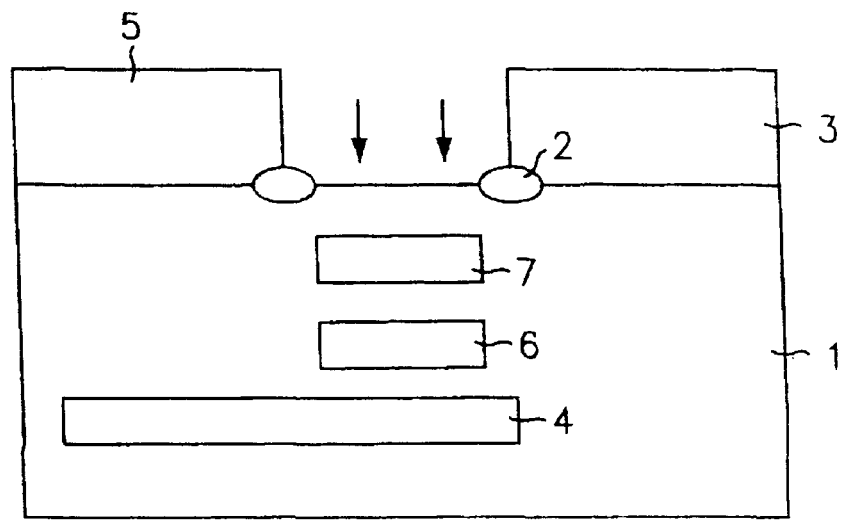
Figure 1D:
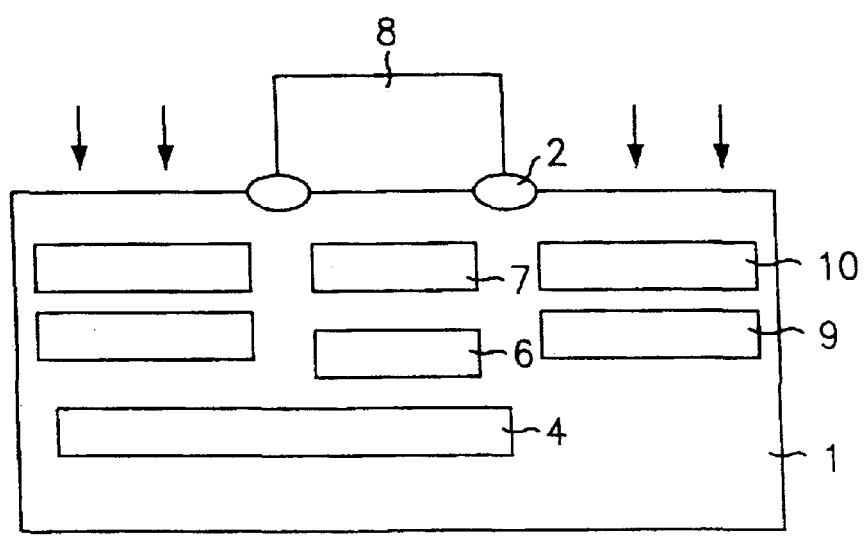
Figure 1E:
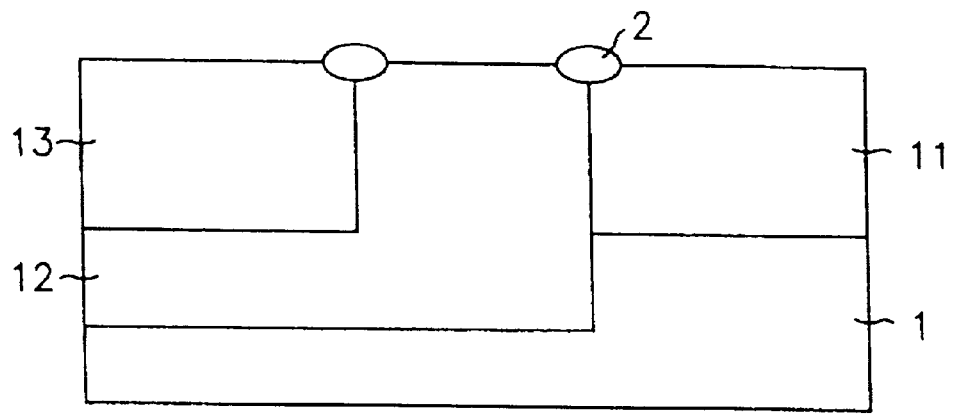
Figure 1F:
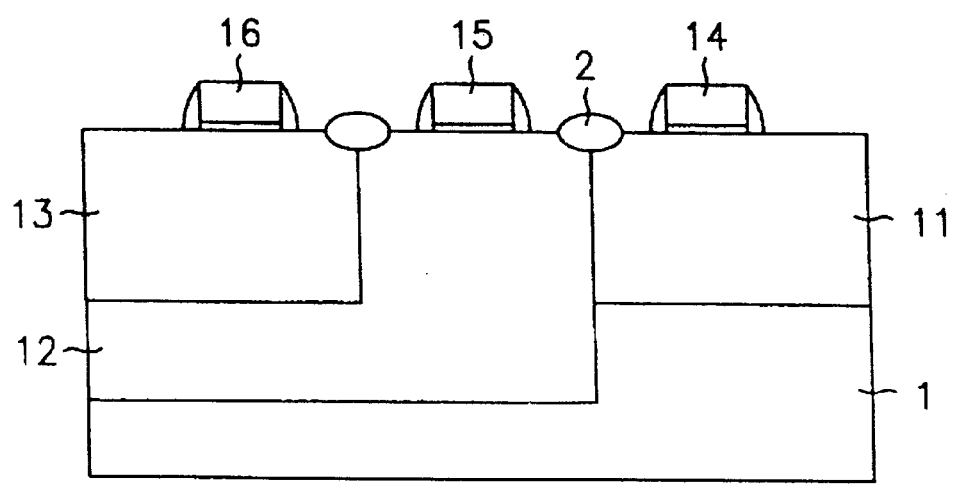
Figure 2:
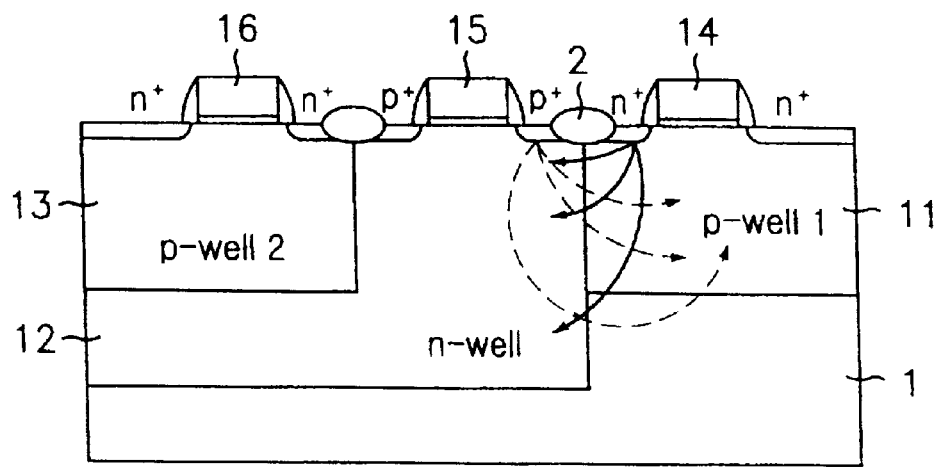
FIG. 2 shows a latch-up phenomenon occurring at the triple well structure of a semiconductor device manufactured by a conventional method.
Figure 3:
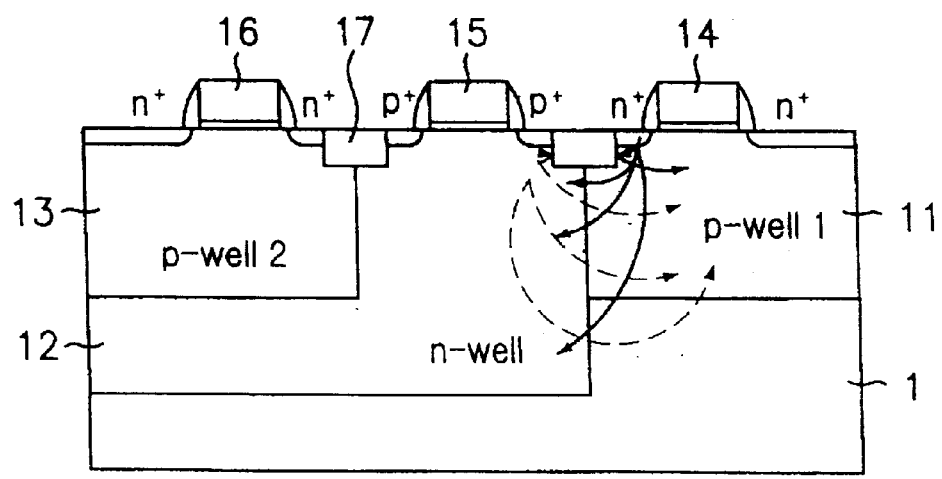
FIG. 3 shows a latch-up phenomenon occurring at the triple well of a semiconductor device having a STI structure, manufactured by a conventional method.

The present invention will be described in detail by way of a preferred embodiment with reference to accompanying drawings, in which like reference numerals are used to identify the same or similar parts.

FIGS. 4A through 4H are flowcharts to illustrate a method of forming a triple well of a semiconductor device according to the present invention.

Figure 4A:
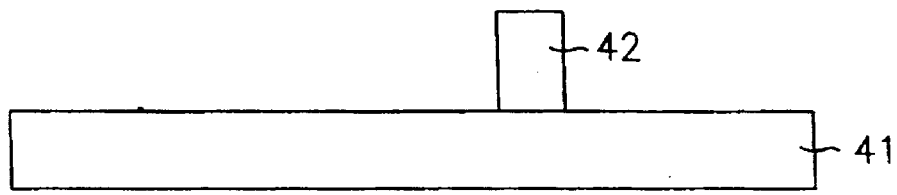
FIGS. 4A through 4H are flowcharts to illustrate a method of forming a triple well of a semiconductor device according to the present invention.
Figure 4B:
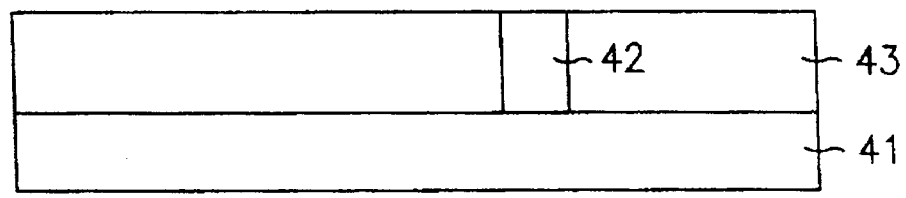

As shown in FIG. 4A, a first oxide film pattern 42 is formed at a given position on a silicon wafer 41. Then, as shown in FIG. 4B, a first silicon epi-layer 43 is formed on the silicon wafer 41 in which the first oxide film pattern 42 is not formed, by means of undoped SEG process. At this time, it is preferred that the first silicon epi-layer 43 is formed 5000 Å through 1 μm. The process for forming a silicon epi-layer using a low pressure chemical vapor deposition (LPCVD) method is as follows.

Before forming a silicon epi-layer in order to prevent from forming a surface natural oxide film of a silicon wafer, the silicon wafer is hydrogen-baked at the temperature of 800 through 900° C. for about 1 through 5 minutes. Upon deposition of the silicon epi-layer, the deposition gas uses a mixture gas of DCS (dichlorosilane) and HCI. Upon deposition, DCS is approximately 30 through 300 sccm and HCI is approximately 30 through 200 sccm. The deposition pressure is about 10 through 50 Torr and the deposition temperature is 850 through 1100° C.

Figure 4C:
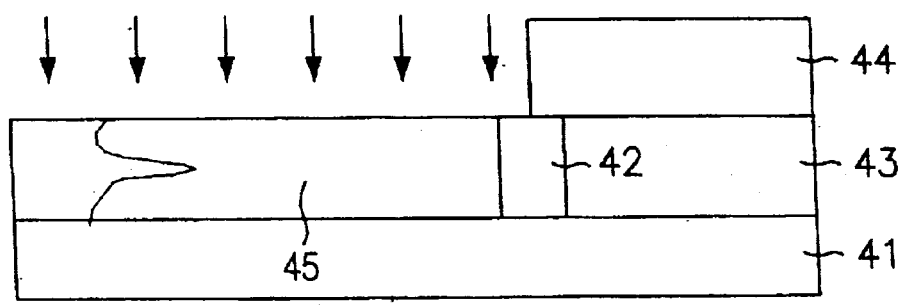

After forming the first silicon epi-layer 43 as explained above, ion injection mask process for forming an underlying n-well is performed using a photoresist 44, as shown in FIG. 4C. Then, an underlying n-well ion injection is performed using a usual medium current ion implanter not a high-energy ion implanter, thus forming an underlying n-well 45 at a given region of the first silicon epi-layer 43. Upon ion injection process for forming the underlying n-well, it is preferred that $^{31}P$ ions are used, the ion injection energy is 50 through 250 keV and the amount of ion injection is $5 \times 10^{12}$ through $1 \times 10^{13}$ ions/cm$^2$.

Figure 4D:
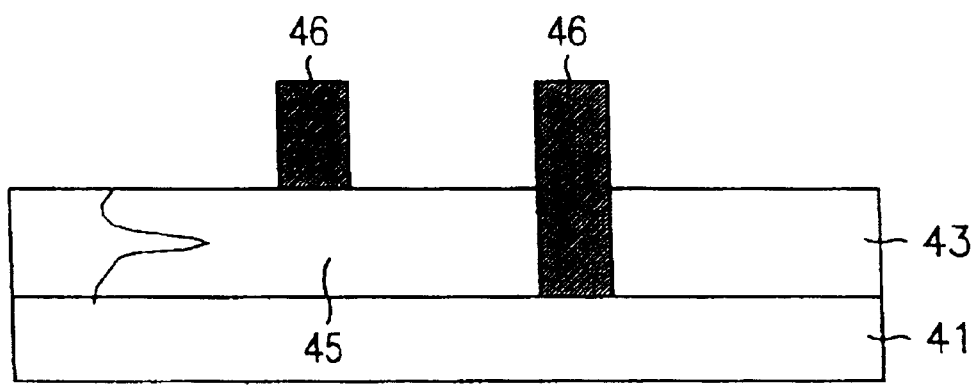

Then, as shown in FIG. 4D, after the photoresist 44 is removed, a second oxide film pattern 46 is formed on the upper portion of the first oxide film pattern 42 and at a given region of the first silicon epi-layer 43.

Figure 4E:
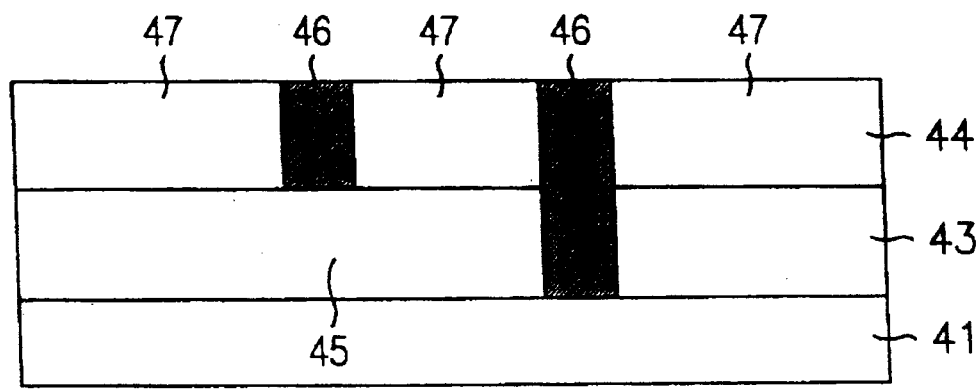

Next, as shown in FIG. 4E, using in-situ boron-doped SEG process, a second silicon epi-layer 47 is formed on the first silicon epi-layer 43. At this time, it is preferred that the second silicon epi-layer 47 is formed 5000 Å through 1 μm. The process for forming a second silicon epi-layer using a low pressure chemical vapor deposition (LPCVD) method is as follows.

Before forming a silicon epi-layer in order to prevent from forming a surface natural oxide film of the silicon wafer, the silicon wafer is hydrogen-baked at the temperature of 800 through 900° C. for about 1 through 5 minutes. Upon deposition of the silicon epi-layer, the deposition gas uses a mixture gas of DCS (dichlorosilane) and $B_2H_6$. Upon deposition, DCS is approximately 30 through 300 sccm, HCl is approximately 30 through 200 sccm and $B_2H_6$ is approximately 100 through 400 sccm. The deposition pressure is about 10 through 50 Torr and the deposition temperature is 850 through 1100° C.

Figure 4F:
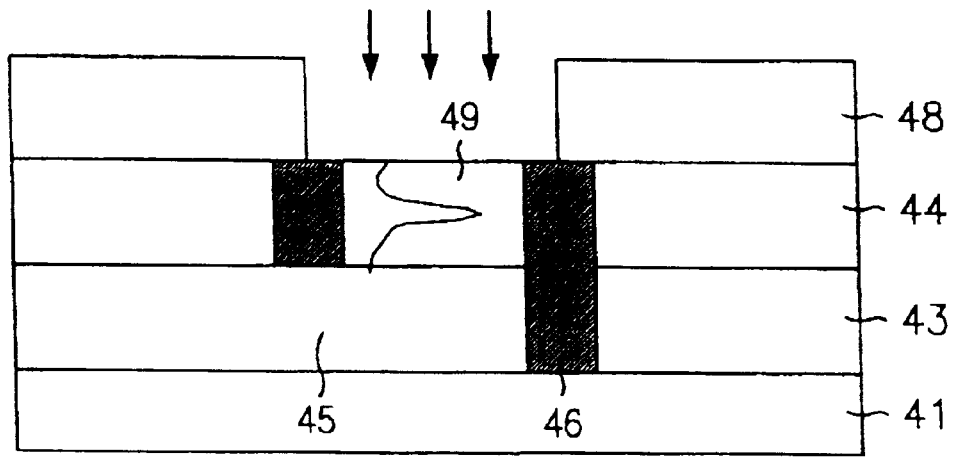

After forming the second silicon epi-layer 43, ion injection mask process for forming an n-well is performed using a photoresist 48, as shown in FIG. 4F. Then, ion injection is performed using a usual medium current ion implanter not a high-energy ion implanter, thus forming an n-well counter doping ion injection region 49 at a given region of the second silicon epi-layer 47. Upon the n-well counter doping ion injection process, it is preferred the $^{33}P^{++}$ ions are used, the amount of ion injection is $5 \times 10^{12}$ through $1 \times 10^{13}$ ions/cm$^2$ and the ion injection energy is 250 through 500 keV using a double charge.

Figure 4G:
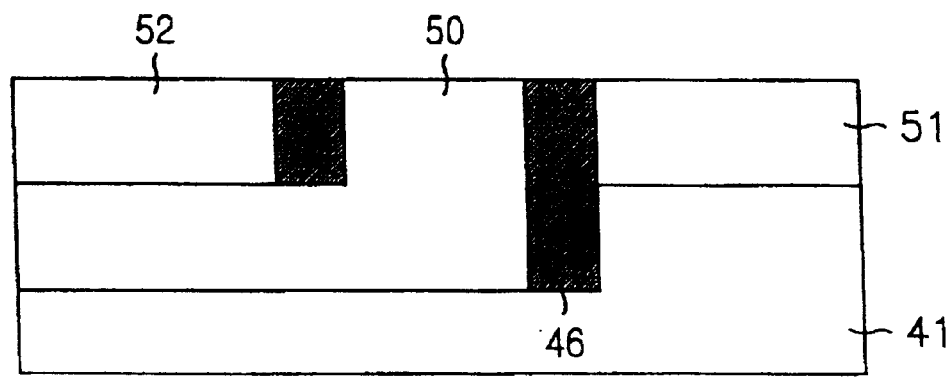

Then, as shown in FIG. 4G, if the photoresist 48 is removed, a profiled n-well 50 can be formed even without using a high-energy ion implanter. Also, a first p-well 51 and a second p-well 52 can be also formed at a given region of the second silicon epi-layer formed using the in-situ boron SEG process using a usual medium current ion implanter not a high energy ion implanter.

Figure 4H:
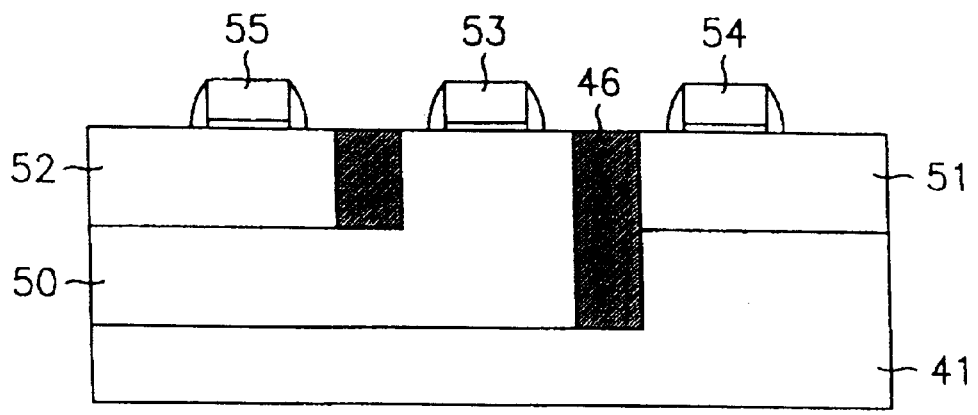

Thereafter, as shown in FIG. 4H, using a subsequent process, a triple well consisted of the n-well 50 and the first p-well 51 and the second p-well 52 surrounded by the underlying n-well, is formed. Also, a pMOS transistor 53 and a first nMOS transistor 54, and a second nMOS transistor 55 are formed at each of the wells, respectively.

Figure 5:
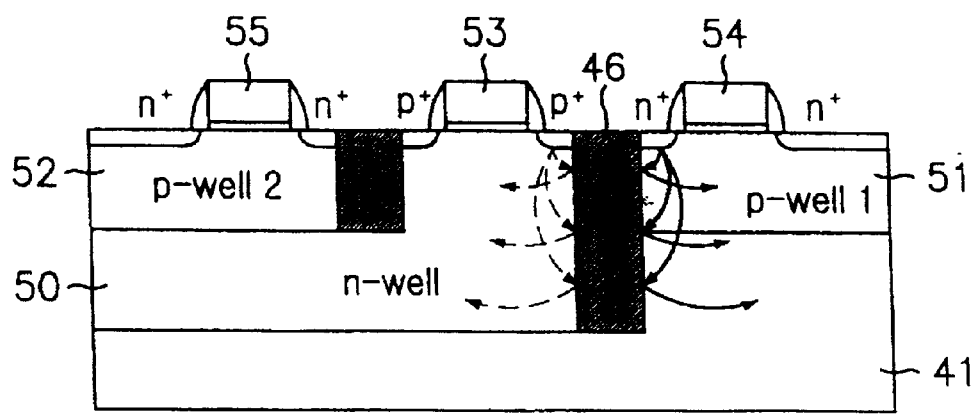
FIG. 5 shows a sectional view illustrating a method of forming a triple well structure of a semiconductor device manufactured by the present invention.

In particular, in the triple well formed according to the present invention, an independent transistor, that is different from the transistor formed at the first p-well, may be formed at the second p-well. As the second p-well is surrounded by the n-well, it can be protected from an external voltage or noises that may be introduced. Also, as schematically shown in FIG. 5, as an oxide film having 1 through 2 μm in thickness exists between the n-well and the first p-well, it can represent a very deep trench device separation structure. Thus, it can block the latch-up current path of the surface and the sidewall, thus making it possible to manufacture a high reliable and qualified device.

As can be understood from the above description with the present invention, it can block the latch-up current path of the parasitic PNPN structure that can be shown due to closely located n-well and p-well junction when a triple well is formed using SEG process and a usual medium current ion implanter, thus making it possible to manufacture a high reliable and qualified device.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of forming a triple well of a semiconductor device using SEG, comprising the steps of:

forming a first oxide film pattern at a given portion on a silicon wafer;

using SEG process, forming a first un-doped silicon epi-layer on the exposed silicon wafer in which the first oxide film pattern is not formed;

selectively performing ion injection to form an underlying n-well at a given region of the first silicon epi-layer;

forming a second oxide film pattern on the upper portion of the first oxide film pattern and at a given region on the first silicon epi-layer;

using in-situ boron-doped SEG process, forming a second doped silicon epi-layer on the first silicon epi-layer;

performing a n-well counter doping ion injection to form a profiled n-well at a given region of the second silicon epi-layer; and forming a first p-well and a second p-well at a given region of the second silicon epi-layer, respectively.

2. The method of forming a triple well of a semiconductor device using SEG according to claim 1, wherein said first silicon epi-layer is formed 5000 Å through 1 μm in thickness.

3. The method of forming a triple well of a semiconductor device using SEG according to claim 1, wherein said first silicon epi-layer is formed by a low pressure chemical vapor deposition method.

4. The method of forming a triple well of a semiconductor device using SEG according to claim 3, wherein when forming said first silicon epi-layer, it is hydrogen-baked at the temperature of 800 through 900° C. for about 1 through 5 minutes before depositing a silicon epi-layer on it, so as to prevent from forming a surface natural oxide film of the silicon wafer.

5. The method of forming a triple well of a semiconductor device using SEG according to claim 3, wherein upon deposition of said first silicon epi-layer, the deposition gas uses a mixture gas of DCS and HCl, wherein DCS is approximately 30 through 300 sccm and HCl is approximately 30 through 200 sccm.

6. The method of forming a triple well of a semiconductor device using SEG according to claim 3, wherein upon deposition of said first silicon epi-layer, the deposition pressure is approximately 10 through 50 Torr and the deposition temperature is 850 through 1100° C.

7. The method of forming a triple well of a semiconductor device using SEG according to claim 1, wherein when forming the underlying n-well, a n-well counter doping ion injection region, the first p-well and the second p-well, ion injection is performed using a usual medium current ion implanter not a high energy ion implanter.

8. The method of forming a triple well of a semiconductor device using SEG according to claim 1, wherein when forming the underlying n-well, $^{31}P$ ions are used, the ion injection energy is 50 through 250 keV and the amount of ion injection is $5 \times 10^{12}$ through $1 \times 10^{13}$ ions/cm$^2$.

9. The method of forming a triple well of a semiconductor device using SEG according to claim 1, wherein said second silicon epi-layer is formed 5000 Å through 1 μm in thickness.

10. The method of forming a triple well of a semiconductor device using SEG according to claim 1, wherein said second silicon epi-layer is formed by a low pressure chemical vapor deposition method.

11. The method of forming a triple well of a semiconductor device using SEG according to claim 10, wherein when forming said second epi-layer, it is hydrogen-baked at the temperature of 800 through 900° C. for about 1 through 5 minutes before depositing a silicon epi-layer on it, so as to prevent from forming a surface natural oxide film of the silicon wafer.

12. The method of forming a triple well of a semiconductor device using SEG according to claim 10, wherein upon deposition of said second silicon epi-layer, the deposition gas uses a mixture gas of DCS and HCl, and $B_2H_6$, wherein DCS is approximately 30 through 300 sccm, HCl is approximately 30 through 200 sccm and $B_2H_6$ is approximately 100 through 400 sccm.

13. The method of forming a triple well of a semiconductor device using SEG according to claim 10, wherein upon deposition of said second silicon epi-layer, the deposition pressure is approximately 10 through 50 Torr and the deposition temperature is 850 through 1100° C.

14. The method of forming a triple well of a semiconductor device using SEG according to claim 1, wherein upon said n-well counter doping ion injection process, $^{31}P^{++}$ ions are used, the amount of ion injection is $5 \times 10^{12}$ through $1 \times 10^{13}$ ions/cm$^2$ and the ion injection energy is 250 through 500 keV using a double charge.

15. The method of forming a triple well of a semiconductor device using SEG according to claim 1, wherein said triple well is consisted of said n-well, a first p-well formed at one side of said n-well, and a second p-well formed at the other side of said n-well and surrounded by an underlying n-well.

* * * * *